(12) United States Patent
Lee et al.

(10) Patent No.: US 9,343,590 B2
(45) Date of Patent: May 17, 2016

(54) PLANAR SEMICONDUCTOR ESD DEVICE AND METHOD OF MAKING SAME

(71) Applicant: GLOBALFOUNDRIES Inc., Grand Cayman, KY (US)

(72) Inventors: Chien-Hsin Lee, Malta, NY (US); Mahadeva Iyer Natarajan, Clifton Park, NY (US); Manjunatha Prabhu, Malta, NY (US); Anil Kumar, Clifton Park, NY (US); Ruchil Kumar Jain, Singapore, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/450,887

(22) Filed: Aug. 4, 2014

(65) Prior Publication Data
US 2016/0035906 A1 Feb. 4, 2016

(51) Int. Cl.
*H01L 29/861* (2006.01)
*H01L 29/06* (2006.01)
*H01L 27/02* (2006.01)
*H01L 29/66* (2006.01)

(52) U.S. Cl.
CPC ........ *H01L 29/8611* (2013.01); *H01L 27/0255* (2013.01); *H01L 29/0684* (2013.01); *H01L 29/66128* (2013.01)

(58) Field of Classification Search
CPC ............ H01L 29/8611; H01L 29/0684; H01L 27/0255; H01L 29/66128
See application file for complete search history.

(56) References Cited

U.S. PATENT DOCUMENTS

2007/0120193 A1* 5/2007 Inoue ............................ 257/358

* cited by examiner

*Primary Examiner* — Long Pham
(74) *Attorney, Agent, or Firm* — Wayne F. Reinke, Esq.; Heslin Rothenberg Farley & Mesiti P.C.

(57) ABSTRACT

An ESD device is provided for protecting a circuit from electrostatic discharge, and includes a planar diode having an anode and a cathode. The anode is electrically coupled to a signal path of the circuit, and the cathode is electrically coupled to a ground of the circuit. The ESD device is configured to be off during normal operation of the circuit and to turn on in response to an electrostatic discharge on the signal path. Two depletion regions in the device are separated by an isolation well. In response to the electrostatic discharge, the depletion regions modulate (e.g., widen and merge), providing a path for the discharge to the ground of the circuit.

15 Claims, 6 Drawing Sheets

PLANAR SEMICONDUCTOR ESD DEVICE AND METHOD OF MAKING SAME

BACKGROUND OF THE INVENTION

1. Technical Field

The present invention generally relates to ElectroStatic Discharge (ESD) semiconductor devices. More particularly, the present invention relates to planar ESD semiconductor devices including a grounded diode.

2. Background Information

Semiconductor devices, such as integrated circuits, are at a risk of damage owing to an occurrence of overvoltages, such as electrostatic discharge (ESD) events, typically as a result of handling by, for instance, humans, machines or both. In addition, existing ESD devices do not adequately protect output transistors, as the output transistors often turn on first. As the integration density of semiconductor devices increases and the corresponding size of circuit elements decreases, a need continues to exist for better protection of the semiconductor devices against such overvoltages.

SUMMARY OF THE INVENTION

In one aspect, a planar diode is provided. The planar diode includes an anode electrically coupleable to a signal path of a circuit, a cathode electrically coupleable to a ground of the circuit, and two depletion regions separated by an isolation well during normal operation of the circuit. The planar diode allows current flow in only one direction and is configured to be off during normal operation of the circuit and to turn on in response to an electrostatic discharge on the signal path.

In accordance with another aspect, a circuit is provided. The circuit includes an input for a signal path, a ground, one or more semiconductor devices, and a planar diode allowing current flow in only one direction. An anode of the planar diode is electrically coupled to the input, a cathode of the diode is electrically coupled to the ground, and two depletion regions separated by an isolation well during normal operation of the circuit. The planar diode is configured to be off during normal operation of the circuit and to turn on in response to an electrostatic discharge on the signal path.

In accordance with yet another aspect, an electrostatic discharge device (ESD) is provided. The ESD includes a first planar diode allowing current flow in only one direction, the first planar diode including a first anode and a first cathode, and a second planar diode allowing current flow in only one direction, the second planar diode including a second anode and a second cathode. The first anode and the second anode are commonly electrically coupleable to an input, the first cathode is electrically coupleable to a signal path of a circuit, the second cathode is electrically coupleable to a ground of the circuit, and, when in use, current flows through only the first planar diode during normal operation of the circuit and through only the second planar diode if the circuit receives an electrostatic discharge. The first planar diode and second planar diode together include two depletion regions separated by an isolation well during normal operation of the circuit.

These, and other objects, features and advantages of this invention will become apparent from the following detailed description of the various aspects of the invention taken in conjunction with the accompanying drawings.

DETAILED DESCRIPTION OF THE INVENTION

Figure 1:
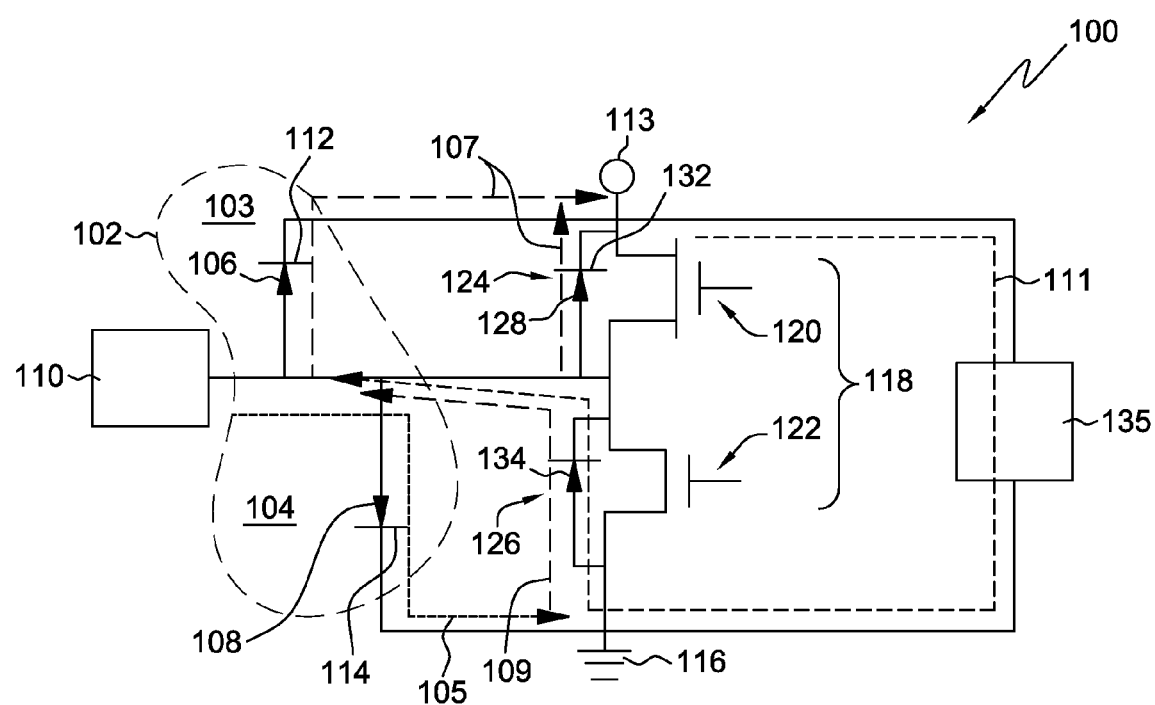
FIG. 1 depicts one example of a circuit including semiconductor devices and an example of an Electrostatic Discharge (ESD) device, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 depicts one example of a circuit 100 including semiconductor devices and an example of an Electrostatic Discharge (ESD) device 102 (a combination of planar diodes 103 and 104, explained in more detail below), in accordance with one or more aspects of the present invention.

In operation, the ESD device is off when circuit 100 is operating normally, and turns on in response to an electrostatic discharge. As shown, the anodes 106 and 108 of diodes 103 and 104, respectively, are commonly electrically coupled (in this example, directly connected) to an input signal pad 110, while the cathode 112 of diode 103 is electrically coupled to a voltage (Vdd) 113 and the cathode 114 of diode 104 is electrically coupled to ground (Vss) 116. An output driver 118 includes a p-type transistor 120 and an n-type transistor 122 in series between voltage 113 and ground 116. Two additional diodes 124 and 126, which may be, for example, conventional diodes, are connected across transistors 120 and 122, respectively. In the case of diode 124, the anode 128 is connected to the cathode 130 of diode 126, while the cathode 132 of diode 124 is connected to voltage 113 and anode 134 of diode 126 is connected to ground 116. Connected between Vdd and ground is an internal circuit or power clamp 135.

The various modes of operation for ESD device 102 and circuit 100 will now be explained. In a first (or ESD) mode of operation, current flows along path 105 from pad 110 to ground 116. In a second mode of operation, current flows along paths 107 from pad 110 to voltage source 113 via diodes 103 and 124 (parasitic diode of output transistor 120). In a third mode of operation, current flows along path 109 from ground 116 to pad 110 via diode 126 (parasitic diode of output transistor 122). In a fourth (normal) mode of operation, i.e., normal operation of the internal circuit/power clamp 135, current flows along path 111 from voltage source 113 to pad 110 via internal circuit/power clamp 135 and diode 126. With these various modes of operation, the ESD device is able to protect both Vss (ground 116) and Vdd (voltage source) 113 from an electrostatic discharge. Conventionally, protecting both Vss and Vdd would require two ESD devices.

Figure 2:
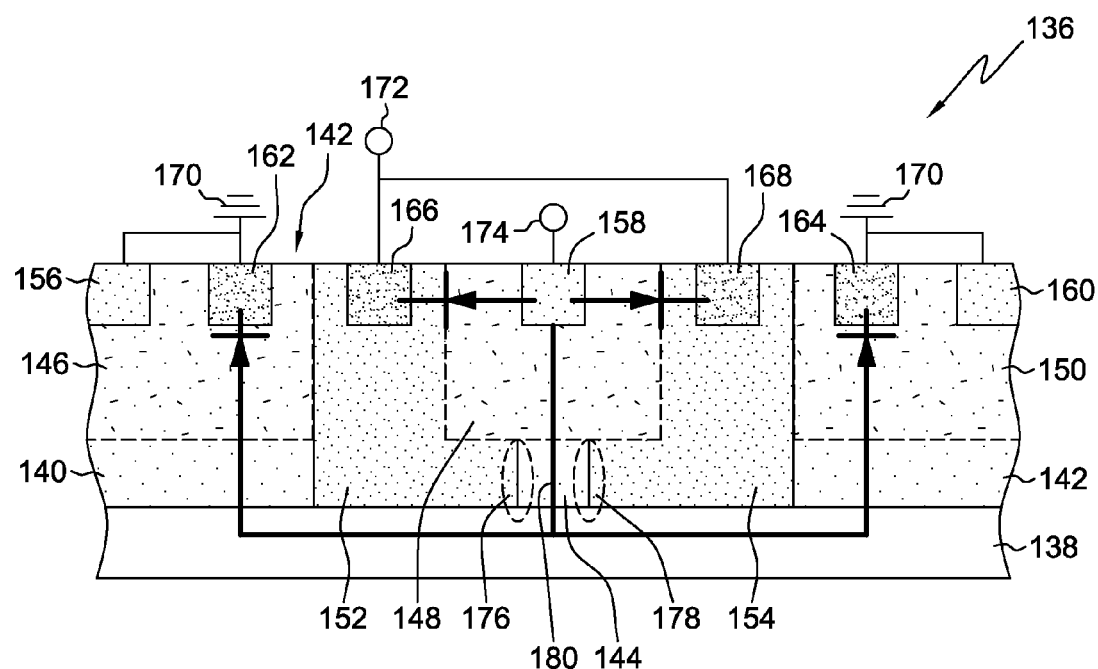
FIG. 2 is a cross-sectional view of one example of an ESD device, in accordance with one or more aspects of the present invention.

FIG. 2 is a cross-sectional view of one example of an ESD device 136, in accordance with one or more aspects of the present invention. The ESD device of FIG. 2 includes a substrate 138. In one example, substrate 138 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 138 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The ESD device of FIG. 2 further includes left 140, right 142 and middle 144 isolation wells. The isolation wells are all of the same type; either n-type or p-type. In the present example, three additional wells of the same type as the isolation wells are present at a top surface 144 of the ESD device; there are left 146, middle 148 and right 150 wells. Two relatively deep wells 152 and 154 of the opposite type extend from the surface, between the left and middle wells and the left and middle isolation wells, and between the middle and right wells and the middle and right isolation wells. At the surface in each of the left, right and middle wells is an implant region (156, 158 and 160) of the same type as the wells. The left and right wells also each include an implant region (162 and 164, respectively) of the opposite type. Finally, each of the two deep wells include at the top surface an implant region (166 and 168) of the same type as regions 162 and 164.

Creation of the various wells and implant regions may be accomplished, for example, using conventional processes. In implementation, the implant regions for the left and right wells of the ESD device may be electrically coupled (connected, in this example) to a ground 170 of a circuit, while the implant regions of the deep wells may be electrically coupled to a voltage 172 of the circuit, and the implant region of the middle well electrically coupled to a signal path (here, pad 174). In operation, two depletion regions 176 and 178 are created between each of the deep wells and the middle isolation well. When an electrostatic discharge is present on the signal path, the depletion regions modulate (e.g., widen and merge), providing a path 180 to the ground of the circuit. The concept is to use depletion layer formation at a given bias condition to provide a predetermined electrostatic discharge current path.

Figure 3:
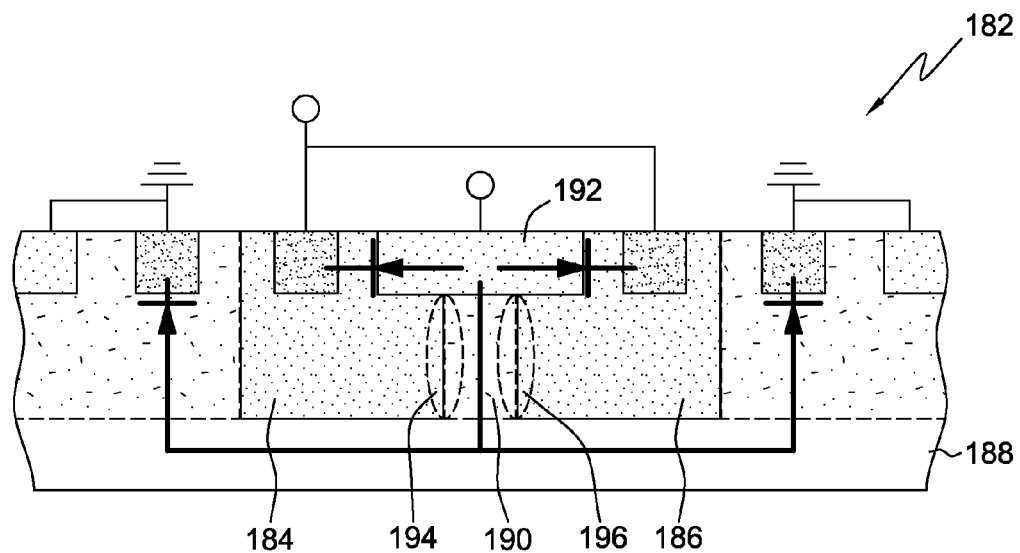
FIG. 3 is a cross-sectional view of another example of an ESD device, in accordance with one or more aspects of the present invention.

FIG. 3 is a cross-sectional view of another example of an ESD device 182, in accordance with one or more aspects of the present invention. The ESD device of FIG. 3 is somewhat similar to that of FIG. 2, except that the deep wells are not deep and there are no isolation wells. Instead, the shortened wells 184 and 186 above substrate 188 are separated only by middle well 190. In addition, the center implant region 192 is wide, extending into wells 184 and 186. The electrical connections to circuit ground, voltage and signal path remain the same as that of FIG. 2. The depletion regions 194 and 196 exist in operation between the shortened wells and the middle well, and modulate (e.g., widen and merge) in the presence of an electrostatic discharge on the signal path.

Figure 4:
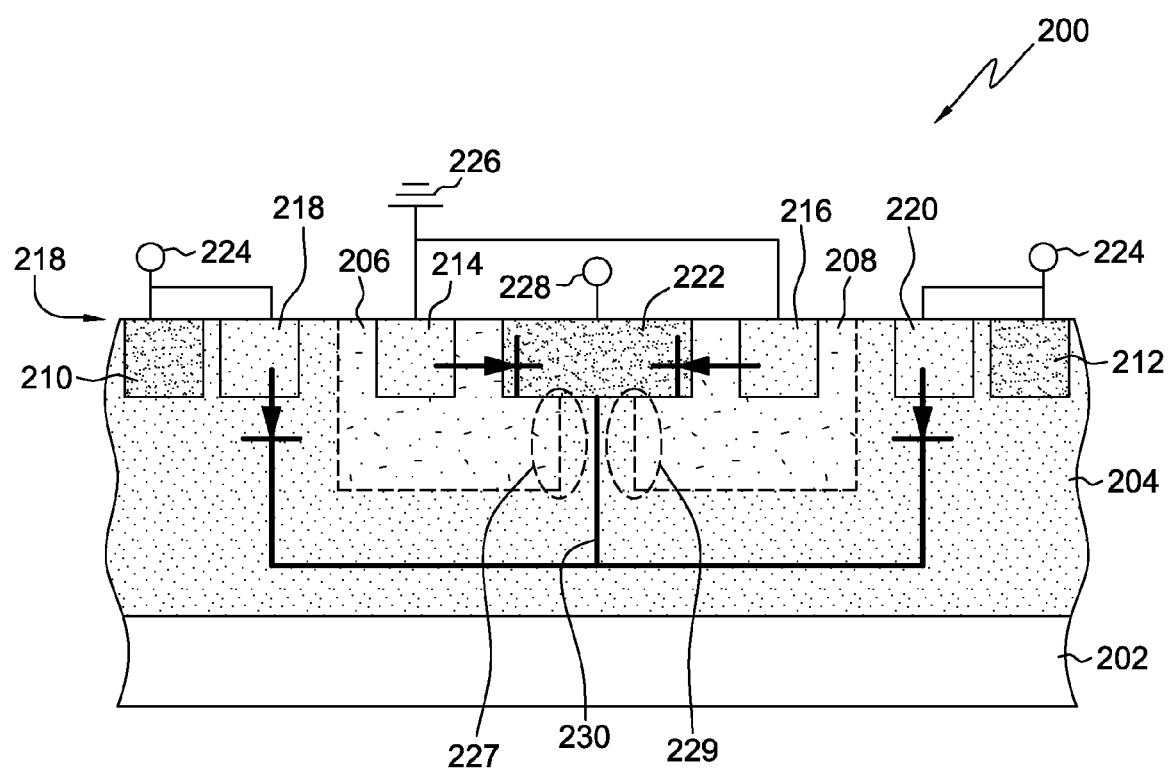
FIG. 4 is a cross-sectional view of a third example of an ESD device, in accordance with one or more aspects of the present invention.

FIG. 4 is a cross-sectional view of a third example of an ESD device 200, in accordance with one or more aspects of the present invention. The ESD device of FIG. 4 operates the same as that of FIGS. 2 and 3. On a substrate 202 of a first type (p-type or n-type) is a relatively deep well 204 of a second type spanning the width of the device. Within the deep, wide well are two wells 206 and 208 of the first type. Implant regions (210, 212, 214 and 216) of the first type are dispersed across a top surface 218 of the device; one on each of the left and right sides of the deep well, and one in each of wells 206 and 208. Implant regions (218 and 220) of the second type are placed on the left and right sides of the deep well adjacent the implant regions of the first type, and a wider one (222) placed in the center, spanning a center of the deep wells and into wells 206 and 208. The depletion regions 227 and 229 exist in operation between the two wells of the first type, and modulate (e.g., widen and merge) in the presence of an electrostatic discharge on the signal path.

Creation of the various wells and implant regions may be accomplished, for example, using conventional processes. In implementation, the implant regions for the left (regions 210 and 218) and right (regions 212 and 220) wells of the ESD device may be electrically coupled (connected, in this example) to a voltage 224 of a circuit, while the implant regions (regions 214 and 216) of wells 206 and 209 may be electrically coupled to a ground 226 of the circuit, and the implant region (region 222) of the middle well (center portion of well 204) may be electrically coupled to a signal path (here, pad 228). In operation, two depletion regions 227 and 229 are created between each of wells 206 and 208, and the center section of well 204. When an electrostatic discharge is present on the signal path, the depletion regions modulate (e.g., widen and merge), providing a path 230 to the VDD of the circuit (i.e., voltage 224). As with FIGS. 2 and 3, the concept is to use depletion layer formation at a given bias condition to provide a predetermined electrostatic discharge current path.

Figure 5:
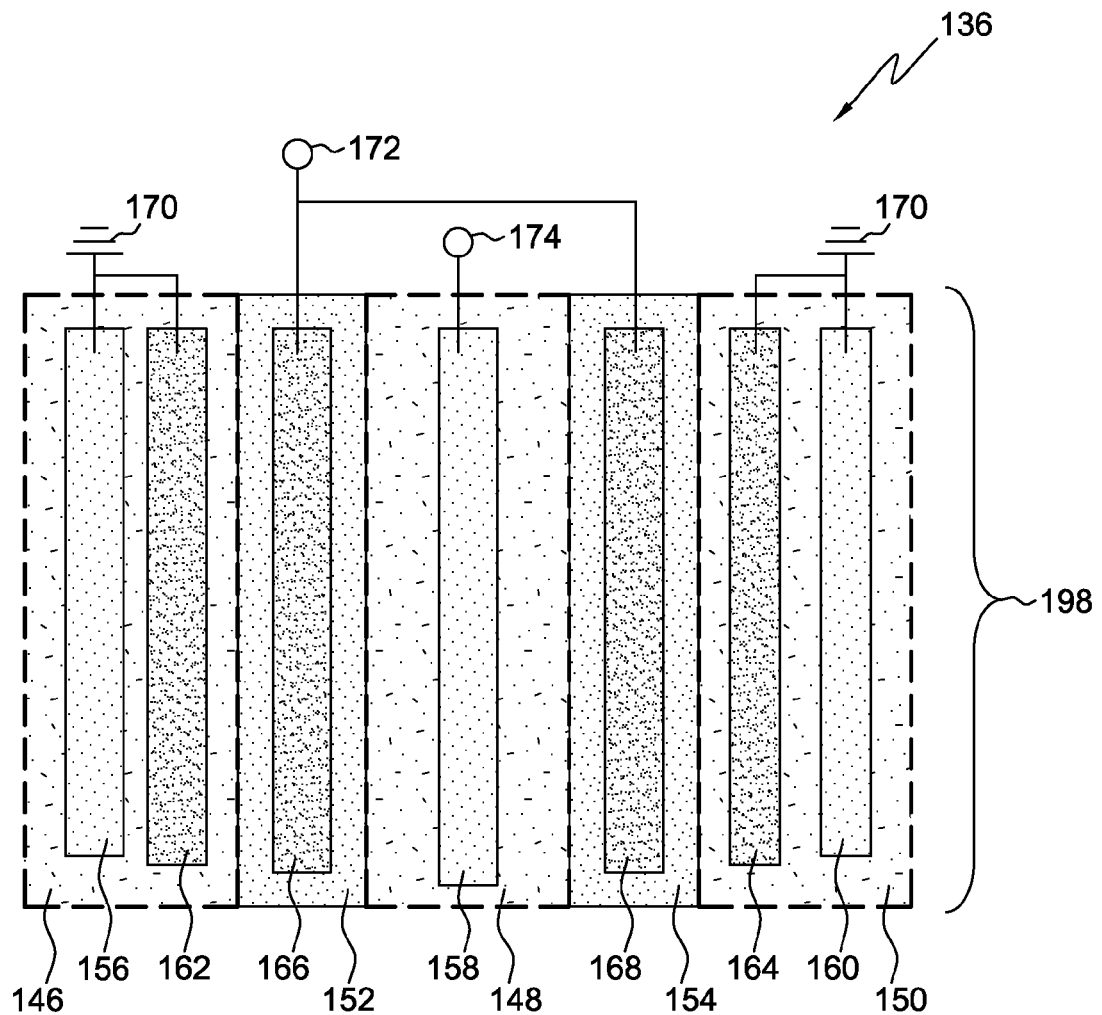
FIG. 5 is a top-down view of one example of the ESD device of FIG. 2, in accordance with one or more aspects of the present invention.

FIG. 5 is a top-down view of one example of the ESD device 136 of FIG. 2, in accordance with one or more aspects of the present invention. As shown in the example of FIG. 5, the implant regions of ESD device 136 are rectangular, spanning most of a length 230 of the device. However, it will be understood that the implant regions could be, for example, other shapes (e.g., circle, square, elliptical, etc.). Further, as will be described in more detail below, the implant regions may be broken up into several smaller areas, depending on the application.

Figure 6:
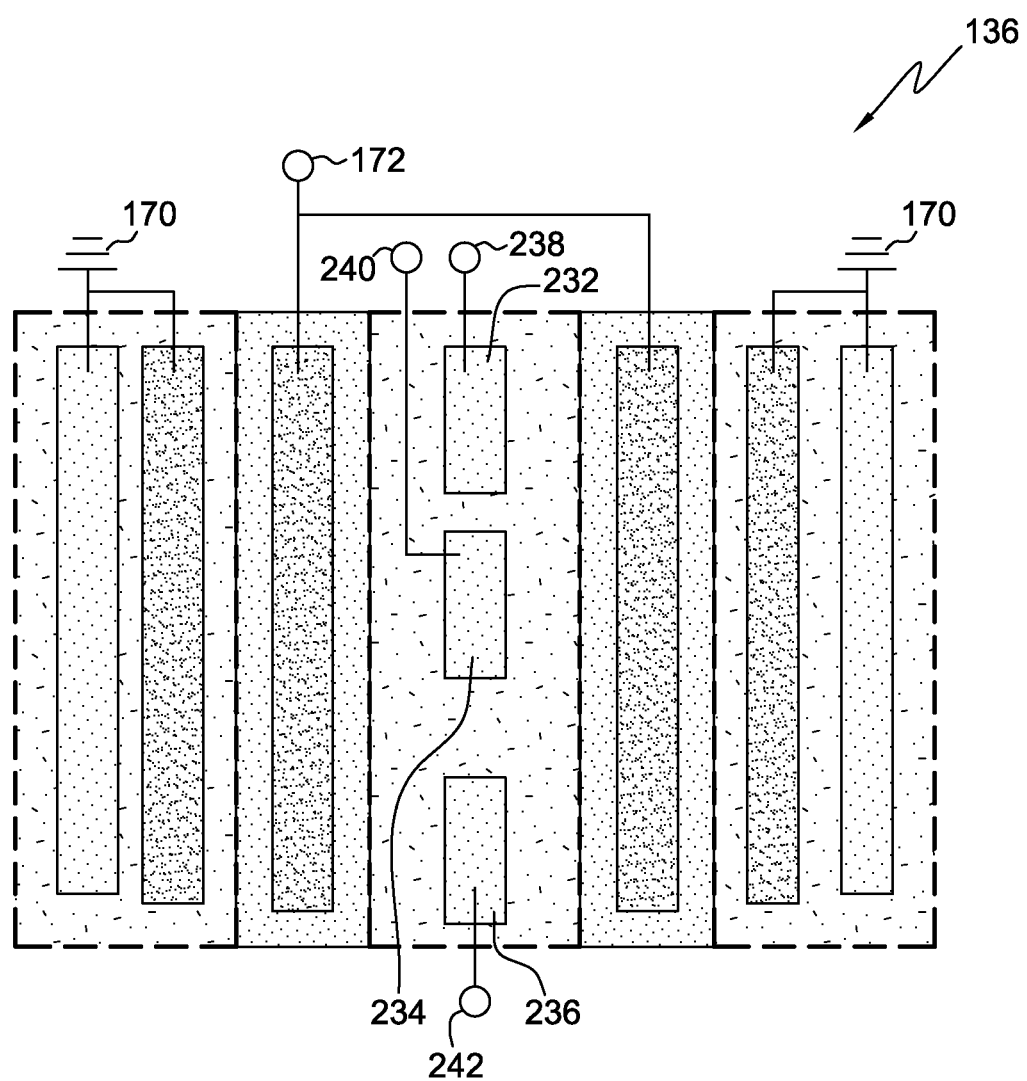
FIG. 6 is a top-down view of another example of the ESD device of FIG. 2 with multiple center implant regions that can be used for multiple different input signals, in accordance with one or more aspects of the present invention.

For example, FIG. 6 is a top-down view of another example of the ESD device 136 of FIG. 2 with multiple center implant regions 232, 234 and 236, that can be used for multiple different input signals 238, 240 and 242, respectively, in accordance with one or more aspects of the present invention. As with the implant regions of FIG. 5, the FIG. 6 implant regions can have different shapes.

Figure 7:
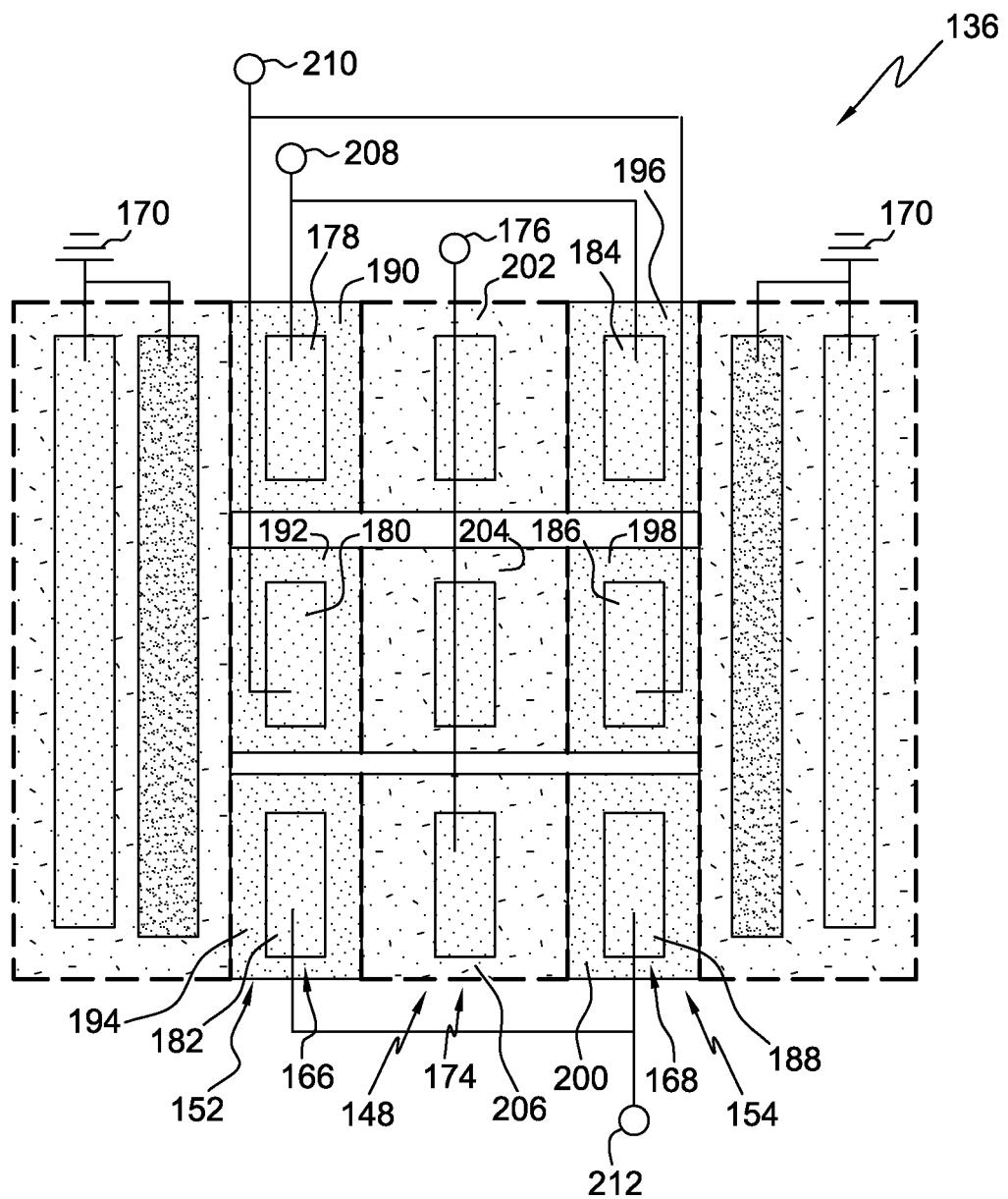
FIG. 7 depicts one example of the ESD device of FIG. 6 with multiple wells for use with multiple different voltages and the center implant regions electrically coupled together, in accordance with one or more aspects of the present invention.

FIG. 7 depicts one example of the ESD device of FIG. 6 with multiples of the deep wells for use with multiple different voltages, and the center implant regions electrically coupled together, in accordance with one or more aspects of the present invention.

As with the ESD device of FIG. 6, the center implant region 174 has been broken up into multiple smaller regions (three, in this example), but instead of each region having a different input, all the regions in the center are commonly electrically coupled to the same input 176. In addition, implant regions 166 and 168 have each also been broken up into multiple smaller implant regions (178, 180 and 182) for region 166; and 184, 186 and 188 for region 168). The same note from FIG. 6 regarding implant region shapes applies to FIG. 7 as well. Further, the deeper wells 152 and 154 have each also been broken into three smaller wells (190, 192 and 194 for well 152; 196, 198 and 200 for well 154; and 202, 204 and 206 for middle well 148). The purpose of breaking up the deeper wells is to electrically couple each pair to a different circuit voltage: wells 178 and 184 electrically coupled to a first voltage 208; wells 180 and 186 electrically coupled to a second voltage 210; and wells 182 and 188 electrically coupled to a third voltage 212.

In a first aspect, disclosed above is a method of protecting a circuit from electrostatic discharge. The method includes, for example, providing a planar diode, the planar diode including an anode and a cathode. The method further includes electrically coupling the anode to a signal path of a circuit, and electrically coupling the cathode to a ground of the circuit. The diode is configured to be off during normal operation of the circuit, and to turn on in response to an electrostatic discharge on the signal path.

In one example, the planar diode may further include, for example, two depletion regions separated by an isolation well, and the electrostatic discharge on the signal path causes the depletion regions to modulate (e.g., widen and merge), providing a path to the ground of the circuit.

In a second aspect, disclosed above is a planar diode. The planar diode includes an anode electrically coupleable to a signal path of a circuit, and a cathode electrically coupleable to a ground of the circuit. The planar diode is configured to be off during normal operation of the circuit, and to turn on in response to an electrostatic discharge on the signal path.

The planar diode of the second aspect may include, for example, two depletion regions separated by an isolation well during normal operation of the circuit. In one example, the two depletion regions modulate (e.g., widen and merge) in response to the electrostatic discharge, providing a path for the electrostatic discharge to the ground of the circuit.

The planar diode of the second aspect may further include, for example, a substrate of a first type, the first type being one of n-type and p-type, a left well, a right well and a middle well of a second type, left, right and middle isolation wells under each of the left, right and middle wells, respectively, a first well of the first type extending between the left well and the middle well and between the left and middle isolation wells, a second well of the first type extending between the middle well and the right well and between the middle and right isolation wells, implant regions of the second type at a surface of the planar diode in each of the left, right and middle wells, and implant regions of the first type in each of the first and second wells of the first type and in each of the left and right wells. The implant region of the second type in the middle well is connectable to a signal path, while the implant regions of the first type are connectable to a voltage source, and both implant regions in each of the left and right wells are connectable to a ground.

During operation of the planar diode, the depletion regions exist between the first well of the first type and the middle isolation well and between the middle isolation well and the second well of the first type, the depletion regions being separated by a portion of the middle isolation well.

In one example, the depletion regions modulate in response to the electrostatic discharge. In one example, the modulation includes an increase in a width of each depletion regions in response to the electrostatic discharge such that the depletion regions merge.

In a third aspect, disclosed above is a circuit. The circuit includes an input for a signal path, a ground, one or more semiconductor devices, and a planar diode, including an anode electrically coupled to the input and a cathode electrically coupled to the ground. The planar diode is configured to be off during normal operation of the circuit, and to turn on in response to an electrostatic discharge on the signal path.

In one example, the planar diode may further include, for example, two depletion regions separated by an isolation well during normal operation of the circuit. In one example, the two depletion regions modulate (e.g., widen and merge) in response to the electrostatic discharge, providing a path for the electrostatic discharge to the ground of the circuit.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A planar diode, comprising:
   an anode electrically coupleable to a signal path of a circuit;
   a cathode electrically coupleable to a ground of the circuit; and
   two depletion regions separated by an isolation well during normal operation of the circuit;
   wherein the planar diode allows current flow in only one direction and is configured to be off during normal operation of the circuit and to turn on in response to an electrostatic discharge on the signal path.

2. The planar diode of claim 1, wherein the two depletion regions modulate in response to the electrostatic discharge, such that a path for the electrostatic discharge is created to the ground of the circuit.

3. The planar diode of claim 2, further comprising:
   a substrate of a first type, wherein the first type is one of n-type and p-type;
   a left well, a right well and a middle well of a second type, the middle well situated between the left well and the right well;
   left, right and middle isolation wells under each of the left, right and middle wells, respectively;
   a first well of the first type extending between the left well and the middle well and between the left and middle isolation wells;
   a second well of the first type extending between the middle well and the right well and between the middle and right isolation wells;
   implant regions of the second type at a surface of the planar diode in each of the left, right and middle wells;
   implant regions of the first type in each of the first and second wells of the first type and in each of the left and right wells; and
   wherein the implant region of the second type in the middle well is connectable to a signal path of the circuit, wherein the implant regions of the first type are connectable to a voltage source of the circuit, and wherein both implant regions in each of the left and right wells are connectable to a ground of the circuit.

4. The planar diode of claim 3, wherein during operation of the planar diode the depletion regions exist between the first well of the first type and the middle isolation well and between the middle isolation well and the second well of the first type, the depletion regions being separated by a portion of the middle isolation well.

5. The planar diode of claim 4, wherein each of the depletion regions modulate in response to the electrostatic discharge, such that a path to the ground of the circuit is created.

6. The planar diode of claim 5, wherein the modulation comprises a width of each depletion region increasing in response to the electrostatic discharge such that they merge.

7. A circuit, comprising:
   an input for a signal path;
   a ground;
   one or more semiconductor devices; and
   a planar diode allowing current flow in only one direction, the planar diode comprising an anode electrically coupled to the input, a cathode electrically coupled to the ground, and two depletion regions separated by an isolation well during normal operation of the circuit;
   wherein the planar diode is configured to be off during normal operation of the circuit and to turn on in response to an electrostatic discharge on the signal path.

8. The circuit of claim 7, wherein the two depletion regions modulate in response to the electrostatic discharge, such that a path for the electrostatic discharge is created to the ground of the circuit.

9. The circuit of claim 8, wherein the modulation of the two depletion regions comprises widening and merging thereof.

10. An electrostatic discharge device (ESD), comprising:
    a first planar diode allowing current flow in only one direction, the first planar diode comprising a first anode and a first cathode;
    a second planar diode allowing current flow in only one direction, the second planar diode comprising a second anode and a second cathode;
    wherein the first anode and the second anode are commonly electrically coupleable to an input;
    wherein the first cathode is electrically coupleable to a signal path of a circuit;
    wherein the second cathode is electrically coupleable to a ground of the circuit; and
    wherein, when in use, current flows through only the planar first diode during normal operation of the circuit and through only the second planar diode if the circuit receives an electrostatic discharge, and wherein the first planar diode and second planar diode together comprise two depletion regions separated by an isolation well during normal operation of the circuit.

11. The ESD of claim 10, wherein the two depletion regions modulate in response to the electrostatic discharge, such that a path for the electrostatic discharge is created to the ground of the circuit.

12. The ESD of claim 11, wherein the first planar diode and second planar diode together comprise:
    a substrate of a first type, wherein the first type is one of n-type and p-type;
    a left well, a right well and a middle well of a second type, the middle well situated between the left well and the right well;
    left, right and middle isolation wells under each of the left, right and middle wells, respectively;
    a first well of the first type extending between the left well and the middle well and between the left and middle isolation wells;
    a second well of the first type extending between the middle well and the right well and between the middle and right isolation wells;
    implant regions of the second type at a surface of the planar diode in each of the left, right and middle wells;
    implant regions of the first type in each of the first and second wells of the first type and in each of the left and right wells; and
    wherein the implant region of the second type in the middle well is connectable to a signal path of the circuit, wherein the implant regions of the first type are connectable to a voltage source of the circuit, and wherein both implant regions in each of the left and right wells are connectable to a ground of the circuit.

13. The ESD of claim 12, wherein during operation of the first and second planar diodes the depletion regions exist between the first well of the first type and the middle isolation well and between the middle isolation well and the second well of the first type, the depletion regions being separated by a portion of the middle isolation well.

14. The ESD of claim 13, wherein each of the depletion regions modulate in response to the electrostatic discharge, such that a path to the ground of the circuit is created.

15. The ESD of claim 14, wherein the modulation comprises a width of each depletion region increasing in response to the electrostatic discharge such that they merge.

* * * * *